United States Patent [19]
Kitayoshi et al.

[11] Patent Number: 5,442,279
[45] Date of Patent: Aug. 15, 1995

[54] APPARATUS AND METHOD FOR DETECTING POWER OF A THREE PHASE ALTERNATING CURRENT SYSTEM

[75] Inventors: Haruyoshi Kitayoshi, Takatsuki; Atsuhiko Tamaki, Kyoto, both of Japan

[73] Assignee: Tsubakimoto Chain Co., Osaka, Japan

[21] Appl. No.: 980,917

[22] Filed: Nov. 24, 1992

[30] Foreign Application Priority Data

Nov. 29, 1991 [JP] Japan ................. 3-361209

[51] Int. Cl.⁶ ................. G01R 21/06; G01R 11/16
[52] U.S. Cl. ................. 324/107; 324/141; 324/142
[58] Field of Search ................. 322/141, 142, 107; 364/483, 481, 492; 324/140, 103 R

[56] References Cited

U.S. PATENT DOCUMENTS

| | | |
|---|---|---|
| 4,454,471 | 6/1984 | Schwendtner et al. ........... 324/141 |
| 4,556,843 | 12/1985 | Milkovic et al. ........... 324/141 |
| 5,017,860 | 5/1991 | Germer et al. ........... 324/141 |
| 5,212,441 | 5/1993 | McEachern et al. ........... 324/142 |

OTHER PUBLICATIONS

Instruction Manual—"Digital AC Power Meter Type 2503" by Yokohawa Denki (Aug. 1983).

*Primary Examiner*—Vinh Nguyen
*Attorney, Agent, or Firm*—Darby & Darby

[57] ABSTRACT

An electric power detector for a three-phase AC voltage supply which measures the current of one phase and the voltage between the one phase and another phase and computes the phase difference between the voltage and the current, decides the phase rotation direction by comparing the phase difference with a specified angle, and obtains a power factor angle by adding or subtracting 30° to or from the phase difference corresponding to the result of the decision to produce a power factor angle for computing three-phase power.

9 Claims, 5 Drawing Sheets

APPARATUS AND METHOD FOR DETECTING POWER OF A THREE PHASE ALTERNATING CURRENT SYSTEM

BACKGROUND OF THE INVENTION

The present invention relates to an electric power detector for three-phase alternating current, and more particularly to an electric power detector useful for detecting the three-phase alternating current of an inverter output.

DESCRIPTION OF THE RELEVANT ART

To simplify detecting three-phase AC power, an electrical power meter of single phase is used to measure electric power in a specified phase and the obtained value is multiplied bye $\sqrt{3}$. For example, as shown in FIG. 1, the R-phase current of the three phases R, S, T is detected by coupling 1 and supplied to an operation unit 3, or the line to line voltage $V_{RS}$ between R-phase and S-phase is supplied to unit 3 by the use of a transformer 2. The operating unit 3 obtains a power factor angle $\theta$ from the detected voltage and current and the three-phase AC power W is computed the following equation.

$$W = V_{RS} \cdot I_R \cdot \cos\theta \tag{1}$$

where $I_R$ is the R-phase current and $V_{RS}$ is the voltage between phases R and S.

In addition a phase difference of R-phase current with respect to R-phase voltage $V_R$ is $\theta$ and gives as:

$$V_R = V_{RS}/\sqrt{3},$$

the three-phase AC power also is represented by $$W = \sqrt{3} \, V_R \cdot I_R \cdot \cos\theta \tag{2}$$

The operation unit 3 performs such computation and displays the result by proper means. An electrical power meter using such detecting method is, for example, a single-phase watt meter model 12433,2503-03 by Yokokawa Denki.

As seen from the above measurement principle, the AC power will be measured to an erroneous value unless the polarity and phase of voltage and current are correctly selected to be connected to the electrical power meter.

In a case where this kind of electrical power meter is connected to the three-phase AC side of an inverter which has a motor load, and the phase rotation is changed to normally or reversely rotate the motor, even when the power meeter is connected to carry out correct measurement during normal rotation of the motor, measurement is impossible during the reverse rotation.

SUMMARY OF THE INVENTION

In order to solve the above-mentioned problems, the present invention has been accomplished. An object is to provide a power detector which can detect three-phase power by measuring single-phase voltage and current and, even when connection is incorrect, can detect it without hindrance. The detector also can accurately detect power even when the phase rotation is inverted as from a three-phase inverter power source.

The three-phase power detection of the present invention provides a first phase current detector, a line to line voltage detector between first and second phases, means for computing a phase difference of a phase current detected by a phase current detector with respect to a line to line voltage detected by the line to line voltage detector, means for comparing the magnitude of the phase difference and an angle $\alpha$ ($30° \leq \alpha \leq 60°$), means for subtracting 30° from the phase difference when it is larger than $\alpha$, and means for adding 30° to the same when it is smaller than $\alpha$, so that the resultant angle of subtraction or addition is used as a power factor.

Another characteristic of the present invention is that, instead of the magnitude comparing means for the phase difference and $\alpha$, there is provided input means for the information of the phase rotation direction which is equivalent to the relation and means for adding or subtracting 30° corresponding to the information so that the result of the addition or subtraction is used as the power factor.

First, explanation will be given on the measurement principle of the present invention. FIG. 2 is a vector diagram showing phase voltages $V_R$, $V_{RS}$ and $V_T$, the line to line voltage $V_{RS}$ between R-phase and the S-phase, and line to line voltage $V_{RT}$ between the R and T phases. The vector $V_{RS}$, during the positive phase rotation, leads R-phase voltage $V_R$ by 30° and, during the negative phase rotation, $V_{RS}$ lags $V_R$ by 30°. FIG. 2 shows the line to line voltages $V_{RS}$ and $V_{RT}$ during the positive rotation. During the negative phase rotation, the line to line voltage $V_{RS}$ is in phase with $V_{RT}$ during the positive phase rotation (shown by $V_{RT} V_{RS}$).

The R-phase current $I_R$ lags the R-phase voltage $V_R$. Now, when $I_R$ is standardized, $V_{RS}$ in the positive phase leads and the phase difference is larger than 30°. $V_{RS}$, in the negative phase, lags from the reference vector $I_R$ as shown by the solid line, or leads as shown by the two-dot chain line and the phase difference is smaller than 30°. Here, 30° represents the phase difference between $V_{RS}$ and $V_R$, or $V_{RT}$ ($V_{RS}$ in the negative phase) and $V_R$.

Accordingly, when the phase difference between $V_{RS}$ and $I_R$ is larger than 30°, the voltage is decided to be in positive phase rotation and when the phase difference is smaller than 30° it is decided to be in the negative phase rotation. When the phase difference is larger than 30°, the phase difference is subtracted by 30°, thereby obtaining a phase difference $\theta$ between the R-phase voltage $V_R$ and the R-phase current $I_R$.

In the negative phase, the phase difference must be smaller than 30°, whereby in this case 30° is added thereto so as to obtain the phase difference $\theta$ between $V_R$ and $I_R$, resulting in that a correct power factor $\cos\theta$ is obtainable in both the positive and negative phase rotations. Accordingly, when the phase rotation direction is changed as in the case of an inverter, and, when the direction is fixed, a correct power factor can be computed whether the polarity and phase are connected correctly or not, thereby enabling the electric power to be correctly detected.

The above explanation typically applies to a case where a load of high power factor of phase difference $\theta$ close to zero (for example, when a large capacity motor is used). When a load of low power factor, close to $\theta = 90°$, as shown by the broken line in FIG. 2 (for example, when a motor of small capacity is used, especially when the more operates with no-load), the phase difference is larger than 30° whether the connection is correct or not, thereby causing inconvenience. Accordingly, in such as case, the positive or negative phase is discriminated by comparing the magnitude with 60°. Of course, since θ changes from 0° to 90° due to the load, a proper phase comparison value in a range of 30° through 60°, corresponding to the value only needed to be taken as a comparison value for discriminating between the positive or negative phase.

The above and further objects and features of the invention will more fully be apparent from the following detailed description with accompanying drawings.

DESCRIPTION OF THE PREFERRED EMBODIMENT

Figure 1:
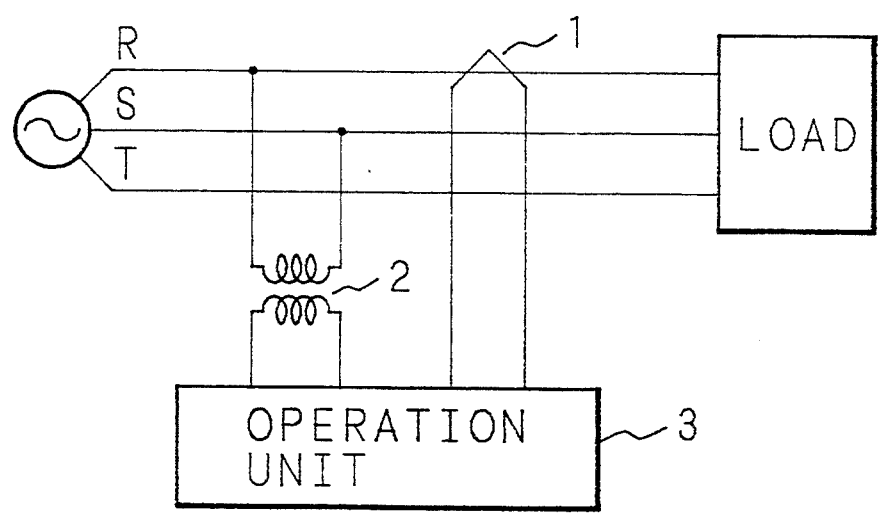
FIG. 1 is an illustration of the conventional prior art electric power detector.
Figure 2:
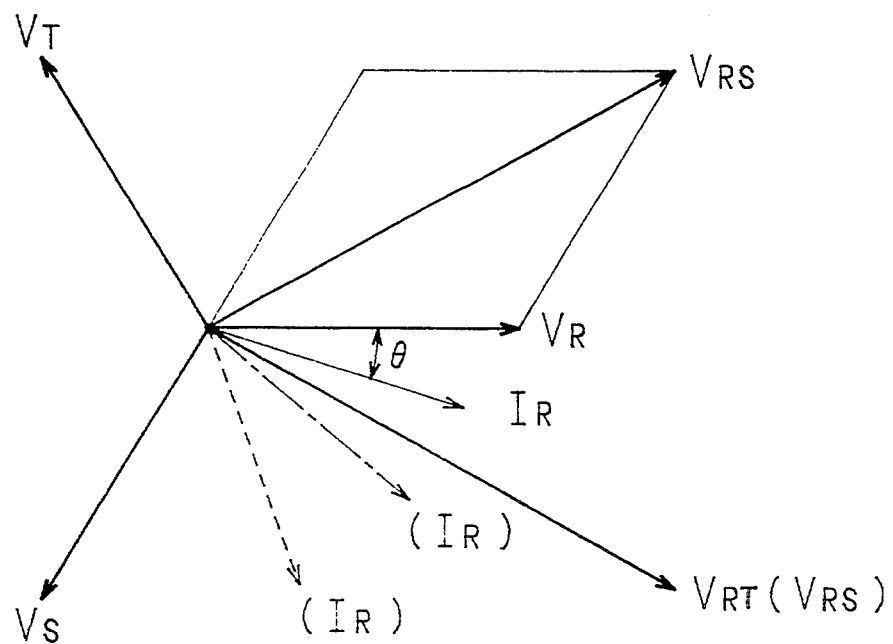
FIG. 2 is an illustration of the measurement principle of the present invention.
Figure 3:
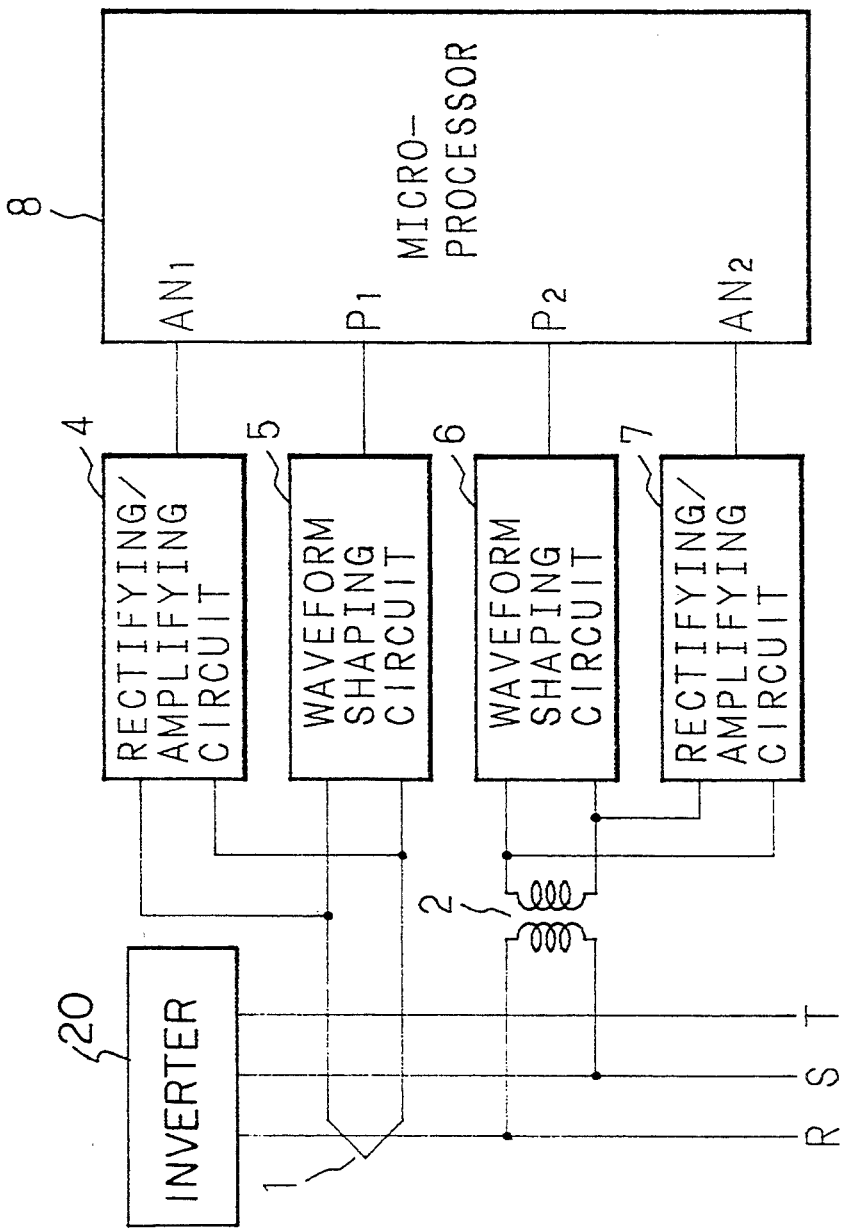
FIG. 3 is a block diagram of an electric power detector of the present invention.

Next, the present invention will be detailed based on the drawings showing an embodiment of the invention. In the drawing of FIG. 3, reference numeral 1 designates a coupling, such as transformer coil, which detects the R-phase current $I_R$ of a three phase current supply provided by an inverter 20. The detected current is amplified by rectifying/amplifying circuit 4, amplified to a proper level and applied to a first analog input terminal AN1 of a microprocessor 8. The detected R-phase current (AC wave) is also converted by a waveform shaping circuit 5 into a rectangular wave which is pulse synchronized with a specified phase (for example, zero cross point) and then applied to an input terminal P1 of the microprocessor 8.

Reference numeral 2 designates a transformer which is connected to the lines to detect line to line voltage $V_{RS}$ between the R- and S-phases. The transformer secondary voltage dropped to a proper level is supplied to a waveform shaping circuit 6 and a rectifying/amplifying circuit 7. The waveform shaping circuit 6 converts and outputs the input AC wave of $V_{RS}$ into a rectangular wave pulse in synchronism with the specified phase the same as the waveform shaping circuit 5 and inputs the pulse into another input terminal P2 of microprocessor 8. The rectifying/amplifying circuit 7 rectifies input voltage,, amplifies it to the proper level, and inputs it to another analog input terminal AN2 of the microprocessor 8.

Figure 4:
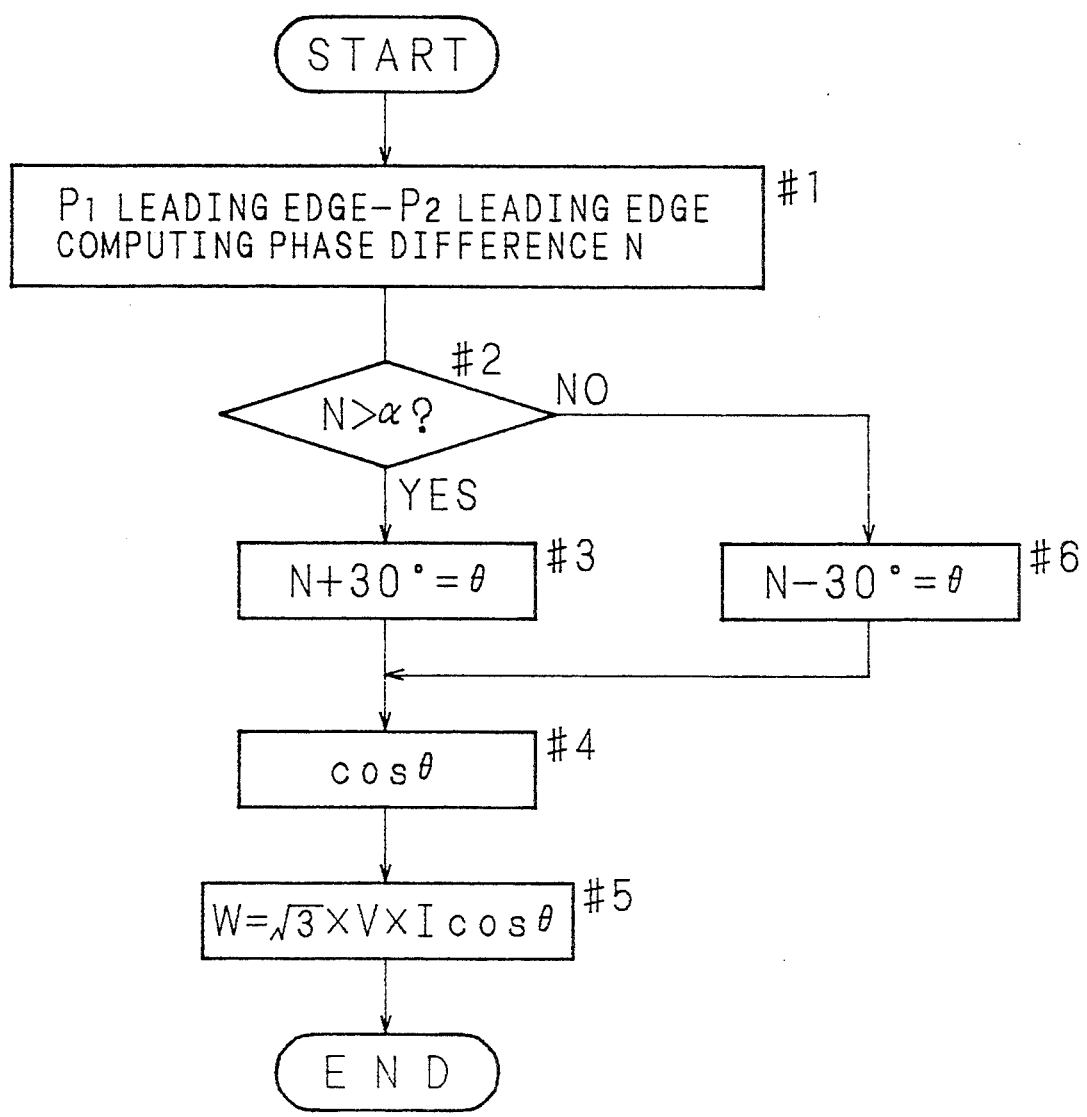
FIG. 4 is a flow chart of the procedure of a microprocessor.

FIG. 4 is a flow chart showing the procedure for power computation by the microprocessor 8.

First, the microprocessor computes the time difference between each leading edge of the pulse input from the input terminals P1 and P2. This is the phase difference N between $V_R$ and $V_{RS}$ (#1). Next, the microprocessor judges whether N is larger or smaller than α (30° to 60°)(#2). When N is larger, 30° is subtracted from N by the microprocessor to compute N−30°=θ (#6). When N is smaller, 30° is added to N to compute N+30°=θ (#3).

Next, a power factor Cos θ is obtained by, for example, a look up table or the like (#4). As input current I and input voltage V from the analog input terminals AN1 and AN2 are used by the microprocessor to compute electric power as follows:

$$W=\sqrt{3}V \cdot I \cdot \cos\theta \quad (\#5)$$

By the use of this apparatus, even when coupler 1 and transformer 2 are incorrectly connected to the rectifying/amplifying circuits 4 and 7 or waveform shaping circuits 5 and 6, and also even when R, S and T current and voltage phases change as in an inverter power source, a correct power factor Cos θ is computed by the above-mentioned principle regardless of an error in connection and change in phase.

Figure 5:
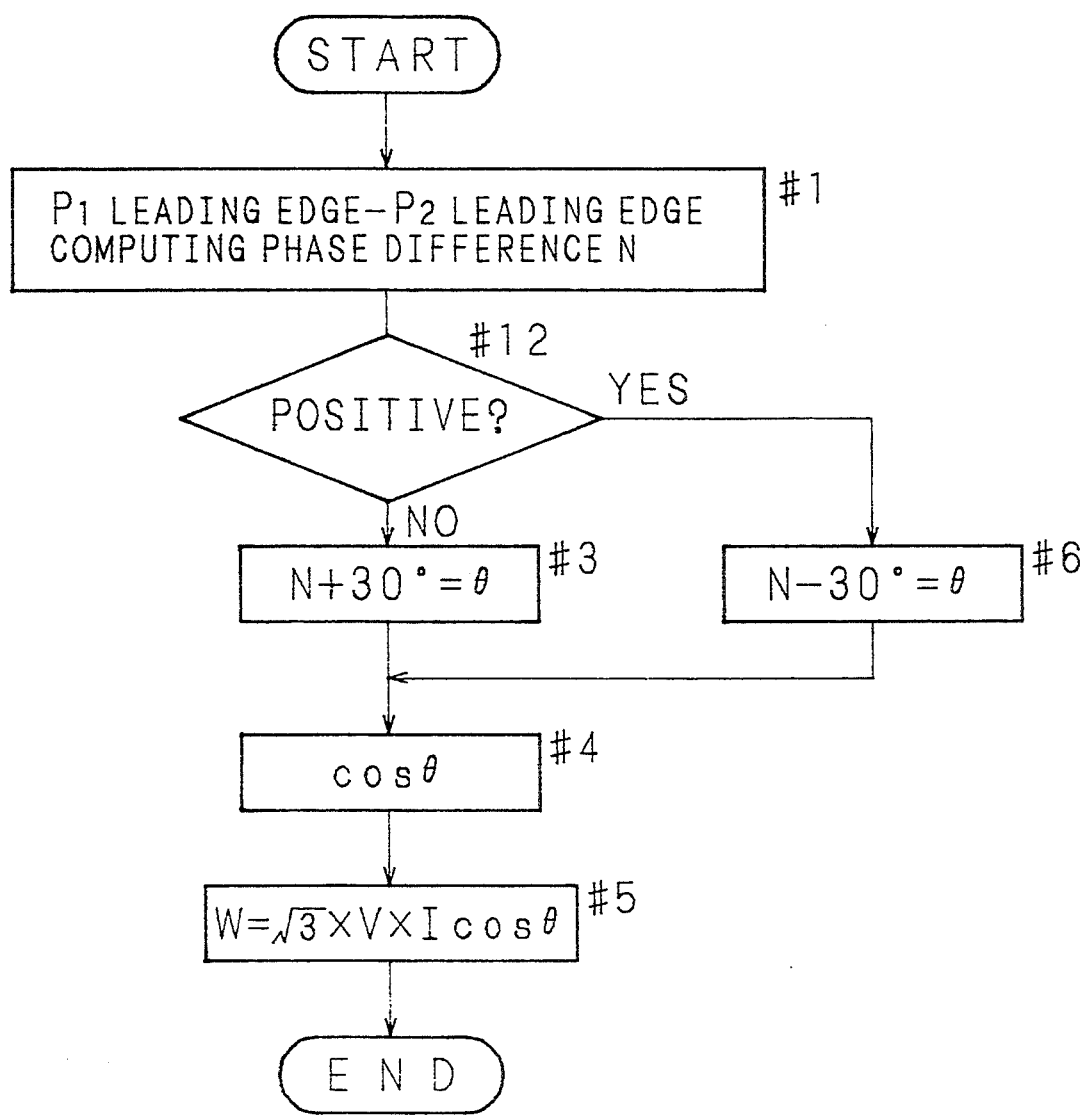
FIG. 5 is a flow chart of the procedure of the microprocessor.

FIG. 5 shows the second embodiment of the procedure for power computation by the microprocessor 8, which is assumed to give the signal to switch positive phase and negative phase to the microprocessor 8, for example, in a motor driving circuit with an inverter power source. In this embodiment, a step #12 is provided instead of the step #2 in which microprocessor 8 decides whether the phase rotation direction (or motor driving rotation direction) is positive or negative. When positive, the procedure transfers to step #6, and, when negative, to step #3.

In addition, in this embodiment, it is required to have no errors in connection.

As seen from the above, the present invention, when the three-phase power is detected by measuring single-phase voltage and current, can correctly detect it without hindrance in spite of errors in connection. Even in the case where the phase rotation is switched to positive or negative, as in the case of a three-phase inverter, correct power detection is possible in any phase rotation. For example, in a case where the motor is driven by the three-phase inverter power supply, when reversely rotated, the power detection can be performed without any hindrance.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the metes and bounds of the claims, or equivalence of such metes and bounds thereof are therefore intended to be embraced by the claims.

What is claimed is:

1. An electric power detector for a three-phase alternating current voltage supply comprising:
    means for detecting the current of a first phase of said supply,
    means for detecting the line to line voltage between said first phase and a second phase of said supply,
    means for computing the phase difference of the current detected by said current detecting means with respect to the line to line voltage detected by said line to line voltage detecting means,
    means for comparing the magnitude of said computed phase difference with a phase difference α (30°≦α≦60°),
    means for subtracting 30° from said computed phase difference when the comparison produces a phase difference larger than α,
    means for adding 30° to said computed phase difference when the comparison produces a phase difference less than α, and means for computing the electric power of the supply using the resultant phase difference of said subtraction or addition as a power factor angle.

2. An electric power detector according to claim 1, wherein α is 30°.

3. An electric power detector according to claim 1, wherein α is 60°.

4. An electric power detector as in claim 1 further comprising a microprocessor including said means for computing the phase difference, said means for comparing, said means for subtracting and said means for adding.

5. An electric power detector as in claim 4 wherein said microprocessor also includes said means for computing the electric power.

6. An electric power detector for three-phase alternating current voltage supply which is changeable in phase rotation comprising, means for detecting the current of a first phase of said supply, means for detecting the line to line voltage between said first phase and a second phase of said supply, first means for computing the phase difference and direction of phase rotation of the current detected by said current detecting means with respect to the line to line voltage detected by said line to line voltage detecting means, means for adding 30° to or subtracting 30° from said computed phase difference corresponding to the direction of the phase rotation, and second means for computing the electric power of the supply using the resultant phase difference produced by said addition or subtraction as a power factor angle.

7. An electric power detector according to claim 6, wherein said three-phase alternating current voltage supply is the output of a three-phase inverter.

8. A method for computing the power (W) of a three-phase alternating current supply comprising the steps of:

detecting the current (I) of one phase of said supply, detecting the line to line voltage (V) between said one phase and another phase of said supply, computing the phase difference (N) between the detected current (I) and line to line voltage (V), comparing the magnitude of the computed phase difference (N) with a phase difference angle α (30°≦α≦60°), and subtracting 30° from or adding 30° to the computed phase difference (N) depending if the comparison is larger or smaller than α to produce a resultant phase angle (θ) and computing the power (W) of the supply using the resultant phase angle (θ).

9. A method as in claim 8 wherein the computing step is carried out in accordance with the formula $$W = \sqrt{3} \times V \times I \cos \theta.$$

* * * * *